US011133359B2

United States Patent
Barkowski et al.

(10) Patent No.: US 11,133,359 B2
(45) Date of Patent: Sep. 28, 2021

(54) INTEGRATED LAYERED ELECTRONIC DISPLAY SHEETS FOR PLACEMENT ON PRODUCT PACKAGING AND IN PRINTED MEDIA

(71) Applicant: INURU GMBH, Berlin (DE)

(72) Inventors: Patrick Barkowski, Berlin (DE); Marcin Ratajczak, Berlin (DE)

(73) Assignee: INURU GMBH, Berlin (DE)

( * ) Notice: Subject to any disclaimer, the term of this patent is extended or adjusted under 35 U.S.C. 154(b) by 0 days.

(21) Appl. No.: 16/335,509

(22) PCT Filed: Sep. 27, 2017

(86) PCT No.: PCT/EP2017/074512
§ 371 (c)(1),
(2) Date: Dec. 4, 2019

(87) PCT Pub. No.: WO2018/060256
PCT Pub. Date: Apr. 5, 2018

(65) Prior Publication Data
US 2020/0144340 A1 May 7, 2020

(30) Foreign Application Priority Data
Sep. 27, 2016 (DE) ...................... 10 2016 118 185.4

(51) Int. Cl.
*H01L 27/32* (2006.01)
*G09F 9/30* (2006.01)
(Continued)

(52) U.S. Cl.
CPC .......... *H01L 27/3239* (2013.01); *G09F 9/301* (2013.01); *G09F 23/00* (2013.01);
(Continued)

(58) Field of Classification Search
CPC ............. H01L 27/3239; H01L 51/0097; H01L 51/5237; H01L 51/5056; H01L 51/5072;
(Continued)

(56) References Cited

U.S. PATENT DOCUMENTS

| 2002/0011786 A1 | 1/2002 | Murasko et al. |
| 2003/0006411 A1 | 1/2003 | Kido et al. |

(Continued)

FOREIGN PATENT DOCUMENTS

| DE | 202007003849 U1 | 6/2007 |
| EP | 2002745 A1 | 12/2008 |

(Continued)

OTHER PUBLICATIONS

English translation of International Search Report dated Mar. 21, 2018 for International Application No. PCT/EP2017/074512 filed Sep. 27, 2017.

*Primary Examiner* — Alexander O Williams
(74) *Attorney, Agent, or Firm* — Blue Filament Law PLLC

(57) ABSTRACT

A thin, sheetlike, electronic, self-powered component including at least a display device and/or a sensor, as well as an energy source or a combination of the preceding is provided. Furthermore, the integration of this electrical component in existing products, especially printing and paper products, without the objects having to be damaged or destroyed is provided.

18 Claims, 3 Drawing Sheets

(51) Int. Cl.
  *G09F 23/00* (2006.01)
  *H01L 51/00* (2006.01)
  *H01L 51/50* (2006.01)
  *H01L 51/52* (2006.01)
  *H01L 51/56* (2006.01)

(52) U.S. Cl.
  CPC ...... *H01L 51/0097* (2013.01); *H01L 51/5056* (2013.01); *H01L 51/5072* (2013.01); *H01L 51/5088* (2013.01); *H01L 51/5092* (2013.01); *H01L 51/5237* (2013.01); *H01L 51/56* (2013.01); *H01L 2251/5338* (2013.01); *H01L 2251/558* (2013.01)

(58) Field of Classification Search
  CPC . H01L 51/5092; H01L 51/56; H01L 51/5088; H01L 2251/558; H01L 2251/5338; H01L 27/32; H01L 51/00; H01L 51/52; H01L 51/50; G09F 9/301; G09F 23/00; G09F 9/33; G09F 23/208; G09F 2003/0272; G09F 3/10; Y02E 10/549
  USPC .......................................................... 257/40
  See application file for complete search history.

(56) References Cited

U.S. PATENT DOCUMENTS

| | | | | |
|---|---|---|---|---|
| 2004/0233537 A1* | 11/2004 | Agrawal | ............... | C09J 163/00 359/604 |
| 2007/0039503 A1 | 2/2007 | Klosowiak et al. | | |
| 2008/0111806 A1 | 5/2008 | Dyre et al. | | |
| 2009/0203174 A1* | 8/2009 | Ichijo | .................. | H01L 21/0234 438/151 |
| 2014/0353619 A1* | 12/2014 | Park | .................... | H01L 27/3248 257/40 |
| 2015/0003040 A1* | 1/2015 | Bessho | ................. | H01L 27/322 362/84 |
| 2015/0028294 A1* | 1/2015 | Kim | ...................... | H01L 27/322 257/40 |
| 2015/0072159 A1* | 3/2015 | Nakamura | ............. | H01B 1/125 428/461 |
| 2015/0115256 A1* | 4/2015 | You | ..................... | H01L 27/1255 257/40 |
| 2015/0270509 A1* | 9/2015 | Ingle | ...................... | H01L 51/56 438/26 |
| 2015/0380608 A1* | 12/2015 | Lowenthal | .......... | H01L 51/5225 257/13 |
| 2016/0285032 A1* | 9/2016 | Popp | ..................... | H01L 51/441 |
| 2017/0023979 A1* | 1/2017 | Yamazaki | ........... | H01L 51/0097 |
| 2017/0040344 A1* | 2/2017 | Fujita | ................. | H01L 29/7869 |
| 2017/0125722 A1* | 5/2017 | Wehlus | ............... | H01L 51/5275 |
| 2018/0061335 A1* | 3/2018 | Fujita | .................. | G09G 3/3291 |
| 2018/0373913 A1* | 12/2018 | Panchawagh | ....... | G01S 7/52079 |
| 2019/0025140 A1* | 1/2019 | Smith | ................... | G06F 3/0418 |

FOREIGN PATENT DOCUMENTS

| WO | 2011018356 A1 | 2/2011 |
|---|---|---|
| WO | 2011098830 A1 | 8/2011 |
| WO | 2014048971 A1 | 4/2014 |

* cited by examiner

INTEGRATED LAYERED ELECTRONIC DISPLAY SHEETS FOR PLACEMENT ON PRODUCT PACKAGING AND IN PRINTED MEDIA

The invention relates to a sheetlike, thin, electrical, self-powered component, consisting at least of a display device and/or a sensor, as well as an energy source or a combination of the above. Furthermore, the invention relates to an integration of this electrical component in existing products, especially printing and paper products, without the objects having to be damaged or destroyed.

BACKGROUND AND PRIOR ART

The integration of electronics in products or articles of daily living where they were not previously integrated enables a multitude of applications. Thus, e.g., the integration of a display device (LED, LCD) in paper as part of advertising or packaging can function as an attention-getting element.

For example, a greeting card is disclosed in DE 20 2007 003 849 U1 which a LED has been integrated together with a power source and a switch in order to generate light effects and images upon opening and closing the greeting card.

Further, a transport container is disclosed in EP 2 002 745 A1, in particular a shopping bag, in whose side surface a lighting means has been integrated, especially a LED. The LED is operated by means of a battery to emit an advertising message.

The known methods of the prior art for the integration of electronics in products are always destructive. The term destructive here means at least partial damaging, destroying, or cutting open of a surface of the product. Thus, in the prior art, the electronics with the display device is usually placed behind an existing surface of the product. For this, it is necessary to cut open the product surface. Furthermore, in order for the display device to be properly visible from the outside, the product surface must be provided with corresponding openings. With the aid of the openings, the user can recognize at a glance that the product comprises an electronics, such as a display device like a LCD, for example. Thus, by this method, the electronics cannot be seamlessly integrated into the existing overall appearance of the product. Furthermore, in order to assure the functionality of the display device, additional electronic components such as batteries, silicon circuit boards, etc., must be installed on the opposite side of the product surface with separate construction and connection sites, such as electrically conducting cables in particular. Both the cutting and punching out of the product surface and the integration of the electronics itself constitute separate steps of the method, making the costs of the integration of electronics by known methods very cost intensive. On the one hand, this is due to the fact that the electronics must either be assembled in advance and then be integrated manually or with the aid of an appropriate mounter on the flexible substrate (e.g., paper); or the electronics is installed on the surface of the product itself by soldering or other processes. The integration process of conventional electronics in product surfaces therefore requires costly soldering processes in order to connect the individual components of the electronics. Moreover, the components of the electronics must be fastened to the back side of the product surface. For this, adhesives or adhesive tapes etc. are used for example in the prior art.

A further drawback of known methods for the integration of electronics in products is that the components are not disposable and/or recyclable. For example, this makes it difficult to use them in paper packages. Because the integration of the electronics in the paper packaging can only be separated with difficulty, the entire paper package is not recyclable trash. Furthermore, conventional electronic components usually have a thickness in the range of a few millimeters and take up too much space in the package or on the paper, thereby changing its feel.

The Problem of the Invention

One problem which the invention proposes to solve is to provide a method and a device which eliminate the drawbacks of the prior art. In particular, one problem of the invention was to provide an electronic component allowing for a simple and cost-effective integration of optical electronics in products. Another problem was to enable such an integration of the optical electronics that merges as seamlessly as possible with the overall appearance of the product.

Summarization of the Invention

The problem according to the invention is solved by the independent claims for an electronic component, a method for the manufacturing of an electronic component, and the use of the electronic component for application on products. The dependent claims relate to preferred embodiments of the invention.

The invention relates preferably to a sheetlike electronic component comprising a display device, an energy source and a conductor track, wherein the component comprises a bottom layer of a nonconducting substrate, a middle layer of electronics, comprising the display device, the energy source and the conductor track, and a top layer of a printable cover layer.

In the sense of the invention, a sheetlike electronic component preferably means an electronic device which is distinguished by its dimensioning, wherein the thickness of the component is distinctly less than its length and/or width. For example, the term "sheetlike" may designate a thickness of less than 1 mm. An electronic component of such a thickness can be produced especially reliably and thus advantageously. It may likewise be preferable for the component to have a thickness of less than 0.3 mm, while its length and width may amount to several centimeters, so that a ratio of the thickness to the length or width of the component will preferably be more than 1:10, more than 1:50 or more than 1:100. Such a component contributes to the miniaturization of optoelectronic components. Thanks to the exceptional thinness, an especially esthetic effect can be accomplished. The sheetlike electronic component is furthermore characterized in that it comprises a display device. A display device preferably designates an electronic component for the generating of visible light, wherein especially preferably organic light-emitting diodes (OLEDs) are meant. OLEDs are characterized by an especially good flexibility and slight layer thickness, so that they can be used to make an especially thin component. Furthermore, the sheetlike electronic component preferably comprises an energy source, which can be for example a flat battery, providing electrical current for the operation of the display device. A galvanic connection between the energy source and the display device is preferably implemented with the aid of conductor tracks. In the sense of the invention, conductor tracks are preferably strips made from a conductive material, preferably having a greater length than width, and serving for the connecting of electronic components.

Preferably, the conductor tracks have a slight thickness of substantially less than 0.3 mm and they can be produced for example with the aid of printing processes. In the sense of the invention, the components of the display device, the energy source and the conductor tracks are also known as electronic component and together form the electronics of the component. If the component in preferred embodiments should comprise further electronic components, such as a switch, sensors, etc., these likewise belong to the electronics.

The component thus comprises an electronics which is self-powered, i.e., can operate the display device, such as an OLED, and make it give off light without the need for an outside power supply.

According to the invention, the component is constructed in layers, wherein the electronic, sheetlike component may also be conceived as being a laminate of different layers. The component preferably comprises three layers. A lower layer preferably constitutes a nonconducting substrate, such as one made of paper or cardboard. This lower layer confers a stability on the component and is preferably suited for gluing the component onto a surface of a product. The component may also be the product itself, i.e., for example a print product, such as the page of a magazine. In this case, the substrate may thus also be a surface of the product, such as a magazine page, on which the electronics is placed. Preferably, the back side, i.e., the side on which no electronics is placed, is printable. Preferably, the substrate is sufficiently nonconducting, so that the electronic components placed on the substrate are not connected through the substrate itself, but only in specific manner, for example with the aid of conductor tracks.

In the middle layer the component preferably comprises the electronics. As stated above, the minimal design of the electronics for the component preferably comprises a display device, an energy source and conductor tracks. It is especially preferable to apply the electronics with the aid of printing processes. These processes mean a savings of time, work stages, and costs. But it may also be preferable for some of the electronic components, such as a battery, not to be applied with the aid of printing processes, but instead to be placed, while other electronic components such as the conductor tracks in particular or an OLED as the display device to be applied with the aid of printing processes. Thus, an especially flexible construction can be provided with a high-power energy source and energy-efficient electronic components. The term "printed electronics" preferably designates the electronics of this middle layer of the component, while the electronic components are applied to the substrate at least partly, preferably entirely, with the aid of printing processes.

On the middle layer comprising the electronics there is preferably placed a third, upper layer, which is a printable cover layer. In the sense of the invention, a printable cover layer preferably means any layer made from a material which can be configured afterwards in further printing processes. It is especially preferable for the printable cover layer to comprise cellulose-containing materials. These materials are especially cost-effective and have diversified uses. Especially preferred printable cover layers are paper, transparent paper, waxed paper and/or film. These materials spare many work stages during the manufacture of the component, and moreover they have a special aesthetic effect. The printable cover layer on the one hand provides an effective protection of the electronics against external influences and on the other hand it enables an optical configuration of the component so that it can be incorporated optimally and practically unnoticeably in a surface of a product. It is especially preferable for the printable cover layer to be at least partly translucent. That is, the cover layer should be chosen such that it allows the light signal of the display device to pass at least partly, so that a consumer can perceive it even through the cover layer. In this way, the desired lighting effect can be accomplished especially effectively. However, it is especially preferable for the cover layer to be transmissible to light, but not transparent, i.e., totally see-through, so that the light of the OLED is scattered on the cover layer. Surprisingly, a translucent cover layer, i.e., one transmissible to light, but not totally see-through, functions as a projection screen or surface for the display device, preferably an OLED, by which the imaging of the display device can be projected. In this way, the end user gets the feeling that the light, the motion, the video or other content being shown by the display device, preferably the OLED, is shown directly on the cover layer, i.e., the screen and/or the paper. An especially aesthetic effect is achieved in this way. But advantageously thanks to the imprinting of the cover layer, precisely those electronic components which are not meant to be visible are covered. It may also be preferable to imprint the portion of the cover layer which is supposed to light up, i.e., above the display device. In this way, the display device, preferably the OLED, is given a structure and seamlessly tied into a printed image. For example, the imprinting of a lamp structure of a spotlight over a completely white OLED can generate a very realistic image. Thus, the optical effect can be achieved with the utmost effectiveness. The surfaces of the cover layer which are meant to light up can preferably be left white in the printed image. But it may also be especially preferable not to imprint the surfaces which are meant to shine through, or to print them only with a glazed coating (part of the surface in patterns). But if, for example, a red image is supposed to appear on a black background, preferably the black background is not imprinted for the full surface, i.e., color dot to color dot, but only in certain structures ensuring a better luminous flux. For this it may be preferably to select patterns, such as color dot (e.g., black), white, color dot, white, etc. These patterns may be implemented with squares, lines, or in other arrangements.

Advantageously, the degree of light transmissivity can be selected by the choice of the pattern. Likewise, the efficiency of the light effect can be optimized in terms of the energy consumed.

The providing of the sheetlike electronic component according to the invention allows integrating electronics, comprising a display device, into a product in an especially easy manner and one achieves a miniaturization. For this purpose, the self-powered electronic component can be applied to the surface of a product with the aid of a glue or other bonding agent. It may be preferable for the electronic component to cover the entire surface of the product. In this case, the imprinting of the cover layer accomplishes the optical configuration of the product and it is not evident to the consumer that an electronics has been applied to the product. Particularly striking effects can be achieved in this way. But it may also be preferred for the component to have a smaller dimensioning than the product surface. Material and thus costs can be saved in this way. However, in this case it is preferable for the component to be thin enough so that it is still incorporated almost seamlessly into the surface of the product. In this way, a special aesthetic effect can be achieved.

In the sense of the invention, product means preferably any article, especially articles of use or decorative items. The term encompasses both active devices and passive objects which are being sold, as well as their packages, which can be decorated with the component, for example. Newspapers, paper, cards, etc., are also understood to be products in the sense of the invention. Preferred areas of application of the invention involve the design of print advertising, packages, point of sale exhibits, bank notes, and much else. Preferably, therefore, the use of the electronic, sheetlike component is not confined to the application of specific articles, but rather it is suitable for many different products. One benefit of the electronic, sheetlike component according to the invention is indeed to achieve the integration of electronics by means of simple labeling or gluing with no complex and destructive integration steps. In this way, electronics can also be integrated in products whose surfaces are especially sensitive with respect to destructive integration steps, such as beverage containers.

It was surprising that an especially thin, sheetlike electronic component could be produced on the basis of the preferred embodiment with the composition of the component by means of thin layers. In this way, the component is especially flexible and thus especially well suited to the integration in a print product. Furthermore, a special aesthetic effect is accomplished. Moreover, such a component is especially robust, reliable and maintenance-free, despite the thin design.

It may also be preferable to apply the electronics directly onto a back side of the cover layer; in this case, a nonconducting substrate is advantageously not needed, or the cover layer functions as a nonconducting substrate for the electronics.

In one preferred embodiment, the invention therefore relates to a sheetlike electronic component comprising a display device, an energy source and a conductor track, wherein a layer of electronics, comprising the display device, the energy source and the conductor track, is placed on a layer of a printable cover layer, which is a nonconducting substrate. In this case as well, a nondestructive integration in the product being outfitted is possible. This preferred embodiment is distinguished by its special simplicity. It can furthermore be designed especially thin and thus flexible.

In one preferred embodiment of the invention, the sheetlike electronic component is characterized in that the component has a thickness less than. 0.3 mm. Advantageously, the layered structure of the component makes it possible for it to have only a very slight thickness of less than 0.3 mm. In this way, the component can be applied to a product, i.e., glued for example, such that it is hardly perceptible by touch or by undesirable optical breaks. Perceptibility means an undesirable appearance, which tells the customer that electronics have been integrated in the product, but not the desired optical signal provided by the display device. Thus, a high degree of miniaturization is achieved, which further results in a special aesthetic effect.

In another preferred embodiment, the sheetlike electronic component is characterized in that the electronics is applied at least partly with a printing process chosen from a group comprising inkjet, screen printing, flexographic printing, and/or offset printing. These methods mean a savings of time, material, labor and costs. It means at least partly in the preferred embodiment that at least some of the components of the electronics have been applied with the mentioned printing processes. This pertains preferably to the conductor tracks. For example, the conductor tracks can be applied to the substrate with the mentioned printing processes. After this, the display device, such as an OLED, can be printed or mounted, or also the energy source, such as a battery, can be printed or mounted, as well as other electronic components such as switches or sensors can be printed or mounted on the conductor tracks. In this way, it is possible with simple process steps to obtain an at least partly printed electronics, which is distinguished by an especially slight thickness and good flexibility. Costly soldering processes such as are usually necessary in the prior art for the integration of conventional electronics in products are advantageously eliminated.

In another preferred embodiment of the invention, the sheetlike electronic component is characterized in that the display device is an organic light-emitting diode (OLED). OLEDs usually consist of a sandwich structure, wherein several layers of organic semiconductor materials are usually located between two electrodes. In particular, an OLED comprises one or more emitter layers (EL), in which electromagnetic radiation is generated, preferably in the visible range, by a recombination of electrons and holes. The electrons and holes are provided respectively by a cathode and anode, while preferably so-called injection layers facilitate the process by lowering the injection barrier. OLEDs therefore usually have electron and hole injection layers. Furthermore, OLEDs generally have hole transport layers (HTL) or electron transport layers (ETL), which support the direction of diffusion of the electrons and holes toward the emitter layer. In OLEDs, these layers are composed of organic materials; in hybrid optoelectronic components, the layers may consist partly of organic and partly of inorganic materials.

As compared to traditional inorganic LEDs, OLEDs and hybrid LEDs are distinguished by a thin and flexible layered structure. For this reason, OLEDs and hybrid LEDs have distinctly more diversified uses than classical inorganic LEDs. Thanks to their flexibility, OLEDs can be readily used for example for monitor screens, electronic paper, or interior lighting. Thanks to these advantageous properties, OLEDs are also especially well suited as a display device for the electronic component, since they allow a slight layer thickness with good flexibility and excellent quality of the light signals.

A number of different OLEDs are suitable for the component according to the invention. Preferably the OLEDs are distinguished by a thin-layered structure. As is known for example from WO 2011/018356 or WO 2014/048971, the OLEDs may also be encapsulated in order to protect the electrically active regions of the OLED especially against water vapor or oxygen, since the lifetime of the OLEDs is significantly reduced when these substances permeate into them.

In one preferred embodiment, the sheetlike electronic component is characterized in that the OLED comprises a cathode, an anode and a layer system between the cathode and the anode, having
  at least one electron injection layer near the cathode,
  at least one electron transport layer
  at least one optically active layer
  at least one hole transport layer
  at least one hole injection layer near the anode
wherein the at least one electron injection layer and the at least one hole injection layer are diffusion-limiting with respect to water and/or oxygen, and the at least one electron transport layer and the at least one hole transport layer constitute a diffusion barrier to water and/or oxygen.

The cathode serves preferably as the electron supplier. Preferably, the cathode has a slight surface resistance, so as to allow the most uniform possible injection or extraction across the surface of the OLED.

The electron injection layer, on the other hand, plays the role of equalizing the work function of the cathode and the following layer, the electron transport layer. The work function corresponds preferably to the minimum energy which must be used to detach an electron from an uncharged solid. By equalizing the work function between the cathode and the electron transport layer, the voltage needed to pump or inject electrons from the cathode into the electron transport layer is reduced and thus the effectiveness of the OLED is increased.

The electron transport layer serves for the directed electron transport between cathode and the optically active layer, i.e., the preferred embodiment of the emitter layer. For this, the electron transport layer should preferably exhibit an adequate mobility of electrons (preferably from $10^{-6}$ to 100 $cm^2/(V*sec)$). In this range, the electron transport layer supports an especially efficient operation of the OLED. In addition, the charge transport energy level, i.e., the conduction band or LUMO (lowest unoccupied molecular orbital) of the electron transport layer, should be between the energy level of the emitter material and the work function of the cathode, i.e., after the work function is performed no additional energy should be needed for the transport of the electrons prior to the recombination with the holes.

The emitter layer consists preferably of semiconducting organic polymers or molecules which produce light in the visible range when electrically excited, i.e., preferably in a wavelength range of 400 to 700 nm. A special aesthetic effect can be efficiently produced in this way. In the emitter layer, the electrons of the cathode recombine preferably with the holes of the anode to form excitons. Preferably, the share of singlet excitons is predominant, so that an effective generating of light occurs.

The hole transport layer is the counterpart to the electron transport layer and it serves preferably for the transport of holes from the anode to the emitter layer. Preferably, the hole transport layer should therefore have an adequate mobility of holes, preferably from $10^{-6}$ to 100 $cm^2/sec$). In addition, the energy level for the transport of the holes, i.e., the conduction band of HOMO (highest occupied molecular orbital) of the hole transport layer, should lie between the energy level of the emitter material and the work function of the anode.

The hole injection layer, like its counterpart on the cathode side (the electron injection layer), preferably consists of strongly dielectric polymers and is preferably an insulator. Preferably, the hole injection layer serves for equalizing the energy levels of the anode and the following layer, the hole transport layer, in order to assure an effective injection of holes.

The anode is preferably the hole supplier and therefore it preferably has a distinctly higher work function than the cathode. Moreover, it is preferable for the anode to have a high surface conductivity for holes. Furthermore, it may be preferable for the anode material to be transparent, in order to make possible a light output through the anode.

For this preferred embodiment, it has been found that a longer lifetime of the OLED should involve in particular a protection of the optically active layer, i.e., the light-generating layer, against the harmful influence of water or water vapor as well as oxygen. Instead of an encapsulation of the overall OLED, electrically active layers are utilized in order to provide a blockade function against water and oxygen.

For this, the at least one electron injection layer and the at least one hole injection layer are diffusion-limiting with respect to water and/or oxygen, whereby the at least one electron transport layer and the at least one hole transport layer form a diffusion barrier against water and/or oxygen. Thanks to this dual functionality of the electrically active layers as both permeation barriers to water and oxygen and to support the directed flow of charge carriers, the preferred OLED can have a much more compact design, so that the electronic component can be especially flat in configuration. In particular, as compared to the encapsulation known in the prior art, the OLED can be protected without limiting the flexibility of the component. At the same time, the susceptibility to disruptive gas inclusions and processing defects of the encapsulation is eliminated.

In the sense of the invention, the attribute of being "diffusion-limiting to water and/or oxygen" is preferably taken to mean that the corresponding injection layers significantly reduce the diffusion of water and/or oxygen molecules. Thus, it may be preferable for the diffusion-limiting layers to increase the path length of the water and oxygen molecules in the layer, so that the molecules do not reach the optically active layers.

In one preferred embodiment, the diffusion-limiting layers have a water vapor transmission rate (WVTR) of less than 1 $g/(m^2*d)$ and an oxygen transmission rate (OTR) of less than 1 $cm^3/(m^2*d)$.

In the sense of the invention, the attribute of a "diffusion barrier" is preferably taken to mean that the corresponding electron and hole transport layers prevent or significantly reduce the permeation of water and/or oxygen molecules. In one preferred embodiment, the electron and hole transport layers acting as diffusion barriers have a water vapor transmission rate (WVTR) of less than 0.1 $g/(m^2*d)$ and an oxygen transmission rate (OTR) of less than 0.1 $cm^3/(m^2*d)$.

However, it is especially preferable for the blockade attributes of the electrically active layers together with the electrodes to satisfy conditions assuring an effective protection of the optically active layer against permeation of water or oxygen. Therefore, it may also be preferable in the preferred OLED for a layer combination of a cathode, the at least one electron injection layer and the at least one electron transport layer to have a water vapor transmission rate (WVTR) of less than 0.01 $g/(m^2*d)$ and an oxygen transmission rate (OTR) of less than 0.01 $cm^3/(m^2*d)$ and/or for a layer combination of an anode, the at least one hole injection layer and the at least one electron transport layer to have a water vapor transmission rate (WVTR) of less than 0.01 $g/(m^2*d)$ and an oxygen transmission rate (OTR) of less than 0.01 $cm^3/(m^2*d)$.

It has been found that preferably it is not the individual diffusion-limiting layers or diffusion barriers which must have quantitative blockade attributes, but instead in particular the layer combination of preferably the electrode and the electrically active layers up to the optically active layer. It may be preferred that the combination of an electrode and an injection layer and a transport layer already preferably has a WVTR or OTR of less than 0.01 $g/(m^2*d)$ or less than 0.01 $cm^3/(m^2*d)$ respectively. But it may also be preferred that the component comprises several, preferably alternating injection layers and transport layers, wherein the layer combination for example of the cathode with the overall electron injection layers and electron transport layers has a WVTR or OTR of less than 0.01 $g/(m^2*d)$ or less than 0.01 $cm^3/(m^2*d)$ respectively. The same holds accordingly for the other electrically active layers. That is, it may also be preferred that the layer combination of the anode with the overall hole injection layers and hole transport layers has a WVTR or OTR of less than 0.01 g/(m²*d) or less than 0.01 cm³/(m²*d) respectively.

Surprisingly, the mentioned values of the WVTR and OTR for the layer combinations of less than 0.01 g/(m²*d) and less than 0.01 cm³/(m²*d) respectively result in an especially effective protection of the optically active layers. Thus, the lifetimes of the preferred light-emitting diodes are significantly increased for the preferred embodiment.

This embodiment with the aforementioned values constitutes an especially maintenance-free component by virtue of the strong, synergistic barrier properties resulting from the combination of the individual layers and their effect being stronger than the sum of the barrier properties of the individual layers.

The embodiment presented here has furthermore proven to be especially less prone to defects during paper printing.

It may likewise be preferable for the optoelectronic component to be characterized in that a layer combination of a cathode, the at least one electron injection layer and the at least one electron transport layer has a water vapor transmission rate (WVTR) of less than 0.1 g/(m²*d) and an oxygen transmission rate (OTR) of less than 0.1 cm³/(m²*d) and/or a layer combination of an anode, the at least one hole injection layer and the at least one electron transport layer has a water vapor transmission rate (WVTR) of less than 0.1 g/(m²*d) and an oxygen transmission rate (OTR) of less than 0.1 cm³/(m²*d). It may be preferred for the combination of an electrode as well as an injection layer and a transport layer to already have preferably a WVTR or OTR of less than 0.1 g/(m²*d) or less than 0.1 cm³/(m²*d) respectively. But it may also be preferred that the component comprises several, preferably alternating injection layers and transport layers, wherein the layer combination for example of the cathode with the overall electron injection layers and electron transport layers has a WVTR or OTR of less than 0.1 g/(m²*d) or less than 0.1 cm³/(m²*d) respectively. The same holds accordingly for the other electrically active layers. That is, it may also be preferred that the layer combination of the anode with the overall hole injection layers and hole transport layers has a WVTR or OTR of less than 0.1 g/(m²*d) or less than 0.1 cm³/(m²*d) respectively.

Due to the finding that it may be adequate, for certain embodiments, to realize the mentioned values for the layer combinations, especially thin layers can be used to achieve the desired functionalities.

Surprisingly, the mentioned values of the WVTR and OTR for the layer combinations of less than 0.1 g/(m²*d) and less than 0.1 cm³/(m²*d) respectively result in a component with electrical properties which can be determined especially reliably in advance, and at the same time it is adequately protected against oxygen and water. Furthermore, it is possible to use especially thin layers with good protective properties and thus longer lifetime of the component at the same time. Hence, a surprisingly long-lived and flexible component is realized.

Likewise, light-emitting components with especially advantageous aesthetic properties (optical brilliance) can be realized in this way. Thus, light-emitting components with the above-mentioned properties can also be used even for extremely thin paper, for example, such as that of daily newspapers, in order to achieve an optical effect (such as blinking lights for automobile advertising).

By water vapor transmission rate (WVTR) is meant preferably a measured value for the permeability of water vapor or water molecules through the individual layer or the layer combination. To determine the WVTR value, one preferably determines the mass of the water molecules diffusing through a surface of the layer within 24 hours. In the present instance, the WVTR is indicated in g/(m²*d) as the preferred unit. Here, the SI units are g for grams, d for day, i.e., 24 hours, and m² for square meter of the surface of the layer or combination layer.

Similarly, by oxygen transmission rate (OTR) is meant preferably a measured value for the permeability of oxygen molecules through the individual layer or layer combination. To determine the OTR value, one preferably determines the gas volume of oxygen molecules diffusing through a surface of the layer within 24 hours. In the present instance, the OTR is indicated in cm³/(m²*d) as the preferred unit. Here, the SI units are cm³ for cubic centimeters, d for day, i.e., 24 hours, and m² for square meter of the surface of the layer or combination layer.

The skilled person knows how to determine the OTR and WVTR of thin layers experimentally and can therefore routinely select the layers according to these properties. Experimental tests for the determination of the OTR and WVTR of thin layers of optoelectronic components are published for example by the American Society for Testing and Materials (ASTM) under ASTM D165343-13 entitled Standard Test Methods for Water Vapor Transmission of Organic Coating Films. The document for the description of the tests was downloaded on 12 Sep. 2016 at https://www.astm.org/Standards/D1653.htm.

Especially thanks to the selection of suitable materials and layer thicknesses resulting on the one hand in the aforesaid electrical properties for the at least one electron or hole transport layer and on the other hand in the desired barrier properties, a component can be realized with the desired optoelectronic properties, at the same time having a long lifetime. Furthermore, the efficiency of the component can be enhanced.

In one preferred embodiment, the preferred OLED is characterized in that the at least one electron transport layer comprises a doped metal oxide, preferably a doped zinc oxide, wherein the doping is done preferably with aluminum, alkali, alkaline earth, metallocenes and/or organic n-dopants and the electron transport layer especially preferably comprises an aluminum zinc oxide. Surprisingly, electron transport layers made of these materials, especially those made of a doped aluminum zinc oxide, are distinguished by an especially good diffusion barrier to water and oxygen molecules and furthermore have optimal electrical properties due to the doping. It is especially preferable for the electron transport layer to consist of one of the aforesaid materials and to have a LUMO between 3-4 eV and an electron mobility between $10^{-6}$ cm²/(V*s) and 100 cm²/(V*s). The skilled person knows how to provide materials with the mentioned parameters without requiring an inventive step.

In one preferred embodiment of the invention, the preferred OLED is characterized in that the at least one hole transport layer comprises a doped metal thiocyanate, preferably a doped copper thiocyanate and/or a doped metal oxide, preferably a doped zinc oxide. These materials can be adapted especially advantageously to the desired properties by an appropriate doping. Furthermore, they possess the desired barrier properties with respect to oxygen and water. Moreover, these materials are very robust and thus contribute to the manufacture of a reliable component. Preferably the materials are doped with a metal thiocyanate. Metal thiocyanates are especially well suited to the doping. Furthermore, they can be used to achieve a broad spectrum of properties which are adjustable by doping. The metal thiocyanates are preferably chosen from a group comprising sodium thiocyanate, potassium thiocyanate, silver thiocyanate, tungsten thiocyanate, vanadium thiocyanate, molybdenum thiocyanate, copper thiocyanate and/or other transition metal thiocyanates. Dopings chosen from the above group allow the precisely targeted adjusting of desired electrical properties. In the individual instance, it is even possible to achieve synergistic effects by virtue of a further improvement of the otherwise good barrier properties of the doped base material. It may likewise be advantageous to dope with a metal oxide. Metal oxides are distinguished by an especially uncomplicated and therefore reliable workability. Preferably, metal oxides are used for the doping that are selected from a group comprising tungsten oxide, vanadium oxide, nickel oxide, copper oxide, molybdenum oxide and/or other transition metal oxides. These are distinguished by a good effectiveness in the doping. Only a few work steps are needed for their processing. But it may also be preferred to do the doping with halogens such as fluorine, chlorine, bromine and iodine. These are distinguished by their pronounced chemical reactivity and by their great prevalence in nature.

For the hole transport layer it is thus preferable to do the doping with a metal thiocyanate, especially preferably a copper thiocyanate or a metal oxide, especially preferably a zinc oxide. The skilled person is aware that a doping in the context of optoelectronic components preferably means the introducing of foreign atoms, the dopant, into a layer, whereby the introduced amount is generally less in relation to the substrate material. That is, it may be preferable for the mass fraction of the dopant to be less than 10%, preferably less than 1%, of the overall layer. But it may also be preferable for the mass fraction of the dopant to be up to 40% of the overall layer. In so-called p-doping, electron acceptors are doped, whereas in so-called n-doping electron donors are doped. For the hole transport layer, it is preferable to choose materials having strong acceptor properties and preferably a LUMO in the vicinity of the HOMO of the substrate of metal thiocyanate or metal oxide, preferably copper thiocyanate or zinc oxide. An organic p-dopant, for example, may also preferably be tetrafluorotetracyanoquinodimethane or also hexaazatriphenylene hexacarbonitrile. These have proven to be particularly useful. They may result in further benefits, such as higher efficiency and reliability, as well as a high yield.

It is especially preferable to use copper thiocyanate or zinc oxide with the aforementioned suitable dopants as the substrate of the hole transport layer.

These aforementioned materials for the hole transport layers, especially when using copper thiocyanate or zinc oxide, are especially effective at preventing a permeation of water or oxygen and at the same time providing excellent electrical properties for the transport of the holes.

In one preferred embodiment of the invention, the optoelectronic component is characterized in that the at least one electron injection layer comprises dielectric polymers. These are distinguished by special robustness, so that a long-lasting component can be created. Thanks to their good barrier properties, synergies are produced which furthermore have positive impact on their longevity. It is especially preferable to use hydrophilic polymers and/or polyelectrolytes. These can be worked especially easily and thus mean a savings in time, material and work stages, and consequently cost. Most especially preferred are polymers chosen from a group comprising poly-oxazolines, polymethacrylates, polyacrylamides, polyethylene oxides, polyacrylic acids, polyacrylates, polyvinyl pyrolidone and co-polymers of this group. These have proven to be particularly usable and are distinguished by superior electrical properties. In particular, the use of polyvinyl alcohol, polyethylene imine or ethoxylated polyethylene imine is preferred, because these result in further improvement and better performance of the component.

The aforementioned materials are especially suited to ensuring the electrical function of the injection layers for electrons. Thus, the electrons as charge carriers can utilize the quantum "tunnel" effect and jump from the cathode to the electron transport layer. The aforementioned dielectric polymers preferably create corresponding surface dipole and thus decrease the injection barrier for electrons. Likewise, the mobility of oxygen and water molecules in the layers is surprisingly strongly decreased or curtailed. Thus, the aforementioned molecules enable an especially reliable implementing of the preferred values for the OTR of less than 1 $cm^3/(m^2*d)$ and for the WVTR of less than 1 $g/(m^2*d)$.

In one preferred embodiment of the invention, the optoelectronic component is characterized in that the at least one hole injection layer comprises dielectric polymers. These have superior barrier properties and thus enhance the reliability. These are preferably polymers with functional groups chosen from a group comprising —CN, —SCN, —F, —Cl, —I and/or —Br, which are especially robust and maintenance-free. The at least one hole injection layer especially preferably comprises polyvinylidene fluoride (PVDF), polyvinylidene chloride (PVDC), polyacrylonitrile (PAN) and/or co-polymers of these, which accomplish an improvement and better performance of the component.

The aforementioned materials are especially suitable for ensuring the electrical function of the injection layers for holes. In particular, the aforementioned polymers fulfill the preferred injection property, i.e., the increasing of the work function for electrons at the contact surfaces with the injection layer and thus an effective hole injection. Furthermore, the materials also have excellent barrier properties for water and oxygen. The aforementioned materials are already being used in part as films for food. It was surprising that these materials can be used to provide injection layers for holes, ensuring both an especially energy-efficient function of the component and an especially long lifetime.

In one preferred embodiment of the invention, the optoelectronic component is characterized in that the at least one electron transport layer has a total layer thickness of 10-50 nm, which is especially robust and reliable. It is preferable for it to have a total layer thickness of 25-30 nm. This has proven to be especially maintenance-free and easy to produce, so that costs can be lowered. The at least one hole transport layer has a total layer thickness of 10-40 nm, which is likewise particularly robust and reliable. A total layer thickness of 10-30 nm is preferred. This has likewise proven to be especially maintenance-free and easy to produce and therefore it lowers the costs. It is especially preferable for the total layer thickness of the hole transport layer to have a thickness of 15-25 nm. This ensures an improvement of the electrical properties. The total layer thickness preferably means the thickness of all electron or hole transport layers. In the case of using each time one electron or hole transport layer, the thickness corresponds to the thickness of the electron or hole transport layer. In the sense of the invention, the thickness preferably means the extension of a layer along the layered structure between the electrodes and along the charge carrier transport. The aforementioned parameters are advantageously optimized so that, on the one hand, an effective protection of the optically active layer, especially against oxygen and water, and on the other hand an especially thin overall structure of the optoelectronic component is implemented. In this way, an especially long-lasting yet thin and flexible component can be provided. Furthermore, the reliability is enhanced, and a special aesthetic effect can be achieved thanks to the thin invisible layers. These also contribute synergistically to the aesthetic effect in an emitting component because the light transmission of the layers is increased and its scattering is reduced.

In another preferred embodiment, the electronic component is characterized in that the at least one electron injection layer has a total layer thickness between 0.1 nm and 10 nm. Such a layer thickness can be worked especially reliably and helps improve the electrical and optical properties. Especially preferable is a layer thickness between 5 nm and 7 nm, since this is an ideal compromise between desired optical and electrical properties on the one hand and better quality of the manufacturing process on the other hand. For the at least one hole injection layer a total layer thickness between 0.1 nm and 10 nm is preferred. The benefits mentioned above for the electron injection layer apply here similarly. This likewise holds for the especially preferred layer thickness between 5 nm and 7 nm. The total layer thickness preferably quantifies the overall extension of all respective electron injection layers and all respective hole injection layers. In the case of a layer, the total layer thickness is preferably equal to the thickness of the layer, or else equal to the sum of the thickness of the individual layers. It has been discovered by the inventors that the aforementioned layer thicknesses surprisingly make possible both excellent blockade properties to water and oxygen and an effective "tunneling", whereby the electrical function is fulfilled.

In this especially preferred OLED, the user of barrier films for the encapsulation of the OLED can be advantageously omitted. In this way, the OLED can be designed especially thin-layered and with a thickness of preferably less than 300 nm, so that the electronic component can be designed especially thin and flexible.

In another preferred embodiment, the sheetlike electronic component is characterized in that the energy source comprises a battery, an organic solar cell and/or a capacitor. The inclusion of a battery enables an independent power supply of the display device with electricity. Batteries are furthermore available at favorable price. Preferably, the batteries can be made from lithium polymers, zinc-manganese and/or aluminum-manganese polymers, since these allow especially flat dimensioning. But it may also be preferable to use an organic solar cell instead of a battery. In this way, it is advantageously possible for the sheetlike electronic component to be energized by ambient light. The organic solar cell can be used to energize the display device directly or to temporarily store the energy so generated in a rechargeable battery or a capacitor, preferably a thin-layer capacitor. This allows the component to be used over especially long periods of time. Furthermore, thanks to the combination of OLED, capacitor and solar cell, a blinking or dimming of the OLED can be accomplished without the aid of transistors. In this case, the capacitor will be charged by the solar cell. With increasing capacitance, the available voltage will increase. Once the voltage of the capacitor V(C) is greater than the V(onbias-OLED), i.e., the On-Set voltage of the OLED, which designates the minimum voltage for the OLED, the OLED will light up. After this, the OLED will shine until the energy of the capacitor is used up. A dimming effect can be easily provided in this way.

Organic solar cells are rather well known in the prior art. The beneficial properties of organic semiconductor materials for the generating of light, as described above for the OLEDs, can likewise be applied to the generating of electric current. Thus, organic solar cells or hybrid solar cells are likewise distinguished by a thin layered structure, which substantially increases the possible applications as compared to classical inorganic solar cells. The structure of organic solar cells or hybrid solar cells has similarities to OLEDs or hybrid LEDs. The use of organic solar cells in the component preferably does not increase the perceptibility of the electronics and thus preserves the special aesthetic effect of the component.

Instead of an emitter layer, however, one or more absorber layers are present as the photoactive layer. In the absorber layer, electron/hole pairs are generated as free charge carriers by virtue of incident electromagnetic radiation. The further layers comprise electron and hole transport layers as well as electron extraction and hole extraction layers. These consist of organic materials or in the case of hybrids they consist of organic and inorganic materials whose electrochemical potentials are shifted such, as donor and acceptor layers, that they generate an internal field in the solar cell, which takes away the free charge carriers to the electrodes. Due to the incidence of the electromagnetic radiation, electrons are provided at the cathode and holes at the anode to generate a voltage or a current.

The organic solar cells of the prior art can already be readily integrated in the electronics of the component, but it may also be preferable to use organic solar cells in which, similar to the especially preferred OLEDs, the electrically active layers, i.e., the electron and hole transport layers and electron extraction and hole extraction layers, possess blockade properties to water and oxygen molecules. The preferably mentioned parameters for the blockade properties apply analogously, while similar materials may also be preferred. The skilled person knows how to adapt the electrical properties of the electrically active layers of an organic solar cell as compared to an OLED. Such a preferred organic solar cell in turn is distinguished by an especially long lifetime, at the same time as having slight thickness (as compared to encapsulated solar cells).

In another preferred embodiment, the sheetlike electronic component is characterized in that the conductor tracks comprise silver, copper and/or carbon as printing material. These materials are distinguished by high conductivity for already small dimensioning and are thus optimally suited to the providing of the printed electronics.

In one preferred embodiment, the sheetlike electronic component is characterized in that the cover layer is at least partly translucent. This can ensure that the display device, preferably the OLED, is visible. It is preferable for the cover layer to be translucent, that is, transmissible to light, but not transparent, i.e., preferably see-through, so that the light of the OLED is scattered on the cover layer. In this way, a projection of the optical image of the OLED on the cover layer can be achieved, so that its content appears especially realistic. Furthermore, an especially inconspicuous integration of the display device in the component can be implemented in this way. This embodiment results in a special aesthetic effect.

In another preferred embodiment, the sheetlike electronic component is characterized in that the cover layer comprises cellulose-containing materials. These are available at favorable cost and can be easily worked. The cover layer comprises preferably paper and/or cardboard. These are cheap and robust. Especially preferably, the cover layer comprises transparent paper, waxed paper and/or films of preferably polyethylene naphthalate (PEN) and/or polyethylene terephthalate (PET). These meet the aforementioned requirements on the optical properties of the cover material especially well. Furthermore, these materials are exceptionally suitable for covering the electronics. They constitute both adequate protection and furthermore are very well printable, so that the optical appearance of the component can be especially well designed.

In particular, by an imprinting of the materials it is possible to effectively cover electronic components such as batteries or conductor tracks, while the OLED for example remains visible. Preferably, the imprinting of the cover layer is done by means of inkjet, digital printing and/or offset. These methods are especially easy and cost-effective to carry out. By appropriate glazings, a plurality of colors can be represented. Furthermore, the mentioned materials have advantageous translucent properties, so that the projection of the light signals of the display device onto the cover layer provides an especially impressive image, appearing to come not from the display device, but directly from the cover layer.

In another preferred embodiment, the sheetlike electronic component is characterized in that the nonconducting substrate comprises paper and/or PET. In particular, with these materials an especially stable and easy integration of the component in a product is possible. On the one hand, the materials are sufficiently thin and flexible. On the other hand, the materials can be glued especially quickly and easily onto a surface of a product. But the nonconducting substrate may also comprise aluminum foil and/or steel plates, containing a nonconducting shielding from the electronics thanks to a coating. Preferred thicknesses of the substrates are between 10-75 µm.

In another preferred embodiment, the sheetlike electronic component is characterized in that an additional nonconducting cap layer is present between the cover layer and the electronics, having a cutout for the display device. This may be applied, for example, with the aid of screen printing. The nonconducting cap layer serves in particular as an additional optical cover, in order to cover components of the electronics which are not meant to be seen, such as conductor tracks or batteries. However, the display device can shine unhindered through the preferred cutout. But it may also be preferred for the cap layer to serve as an optical barrier in order to cover parts of the OLED. Instead of integrating the cap layer between the cover layer and the electronics, it may also be printed directly on the cover layer by means of opaque colors, such as opaque white. This can be done on both sides. If this is done on the side where the print image will later be applied, first the cover layer and then the print image will be printed. This furthermore allows the application, preferably the printing, of the electronics directly on the back side of the cover layer. If, instead, the cap layer is applied by printing on the back side of the cover layer, then the electronics can be printed on the cover layer after this. In this embodiment, therefore, the electronics are preferably applied to the cover layer and not to a separate substrate or the cover layer functions as a substrate. In this way, 1-2 layers can be spared advantageously. The cap layer preferably serves as an equalizing layer, which can equalize the different height of components of the electronic layer. In this way, a seamless tactile and optical integration of the electronics can be achieved. Furthermore, the cap layer may function as additional protection for the electronics and increase the robustness of the component.

In another preferred embodiment, the sheetlike electronic component is characterized in that the electronics comprises a switch for the activating of the display device. In order to turn on the display device, a manually activated contact switch may be integrated. This switch can close a circuit by integration of a separate component, such as a familiar pressure switch, and at the touch of a finger, whereby the energy source is connected to the display device and the latter lights up. Hence, the display device can be turned on and off, as needed. This enhances the energy efficiency and the lifetime.

In another preferred embodiment, the sheetlike electronic component is characterized in that the cover layer and/or the nonconducting cap layer has a cutout above a conductor track, whereby a circuit is closed by its contacting a conductive object, so that the display device lights up. It is especially preferred that the cover layer does not have a cutout, but rather only the nonconducting cap layer has a cutout. By touching the cutout and thus the underlying conductor track, a circuit can thus be made in simple manner as with the aforementioned contact switch. Given an appropriate configuration of the conductor tracks, the display device can only light up when the cutout is contacted. Such a switch makes possible an interactive and thus especially appealing use of the component. A special aesthetic effect is achieved.

In another preferred embodiment, the sheetlike electronic component is characterized in that the electronics comprises a sensor, preferably a light sensor. In the field of packaging or print advertising, it may be desirable for the component to light up only for example when standing in front of the shelf in the supermarket or only when the user takes out and looks at the side with the integrated print advertising. This is accomplished in that a light-sensitive sensor is integrated in the component. Since the cover layer is preferably translucent, the sensor receives sufficient energy and makes the circuit only after a defined light impinges on it. Energy costs can be spared thanks to this preferred embodiment.

In another preferred embodiment, the sheetlike electronic component is characterized in that the electronics comprises a control electronics with one or more transistors. In this way, even more complex control processes are possible in the display device with temporal and/or spatial patterns. The control electronics may also comprise a communication unit for communication with external devices. The communication may take place for example with the aid of antennas, RFID, NFC, Blue Tooth Low Energy or light frequency transmission. In this way, the component may also be activated and/or regulated from the outside, thereby obtaining a better potential for involving the consumer. For example, they may use their smartphones to cause the electronic component to light up by means of Bluetooth or the component can receive data from the smartphone and present personalized content accordingly.

In another preferred embodiment, the invention relates to a method for manufacturing a sheetlike electronic component according to the invention, involving the following steps
  providing of the nonconducting substrate
  placing of the electronics comprising the display device, the energy source and the conductor tracks on the substrate
  placing of the printable cover layer on the electronics. In this way, a particularly robust and maintenance-free component can be provided.

In another preferred embodiment, the invention relates to a method for manufacturing a sheetlike electronic component according to the invention or preferred embodiments thereof, involving the following steps
  providing of a cover layer placing of a cap layer on the front and/or back side of the cover layer placing of the electronics on the back side of the cover layer or the cap layer. Such a component is very reliable and can be manufactured in especially easy manner.

In this embodiment, therefore, the electronics is preferably applied on the cover layer and not on a separate substrate, i.e., the cover layer with the cap layer functions as a substrate. In this way, layers can be spared advantageously.

The skilled person will recognize that the preferred embodiments and their benefits as have been disclosed for the sheetlike electronic component likewise hold for the method according to the invention. Thus, for example, it has been disclosed that it is preferable for the component that the conductor tracks be applied with the aid of a printing process chosen from the group comprising inkjet, screen printing, flexographic printing, offset printing, preferably making use of silver, copper and/or carbon. Thus, the skilled person will recognize that the embodiment is also preferred for the method according to the invention whereby the applying of the electronics involves such printing processes for the applying of the conductor tracks. Such a method, furthermore, is especially easily streamlined and automated.

In another preferred embodiment, the invention relates to a use of the sheetlike electronic component according to the invention for the design of products and packages, especially print and paper products, wherein the sheetlike electronic component is placed on a surface of the products or packages with the aid of a glue. Such a use may result in a special aesthetic effect in its interaction with the product.

In another preferred embodiment, the invention relates to a product characterized in that the sheetlike electronic component according to the invention or preferred embodiments thereof is applied to one surface of the product. The application is preferably by a gluing of the substrate onto the product surface. This embodiment is especially robust.

In another preferred embodiment, the invention relates to a product, wherein the product comprises a surface of an at least partly translucent material, having an imprinting on one side, wherein an electronics comprising a display device, an energy source and a conductor track is applied to the opposite side of the imprinting, so that the light signal of the display device is visible through the surface. In this way, a special optical effect can be achieved.

It may thus also be preferred to use surfaces of the product as a nonconducting substrate or translucent cover layer, on which the electronics is applied. For this, it is preferable for the product surface to have a corresponding translucence, i.e., an at least partial light transmittance. The light output can be improved by the imprinting of particular solvent and/or material combinations on a nontransparent or semitransparent or opaque layer. It is especially easy to implement this embodiment.

In another preferred embodiment, the invention relates to the product, wherein the surface is a cardboard and/or a paper, and the surface is applied to a corrugated cardboard with the aid of an adhesive bonding. In this product, therefore, the integration of the electronics into a product according to the invention is mediated by known laminating processes. These are used in particular for the production of packages. A printed carton is applied by means of gluing to a corrugated cardboard. In the preferred embodiment, the electronics is printed or applied on the non-printed side of this same carton. If this carton is sufficiently translucent, the described projection of the image of the display device onto the front side of the carton can be advantageously accomplished, which thus constitutes a translucent cover layer. Such a product can achieve a special aesthetic effect in especially easy manner.

Detailed Specification of the Invention

In the following, the invention will be explained more closely with the aid of examples, without being limited to these.

DETAILED DESCRIPTION OF THE FIGURES

Figure 1A:
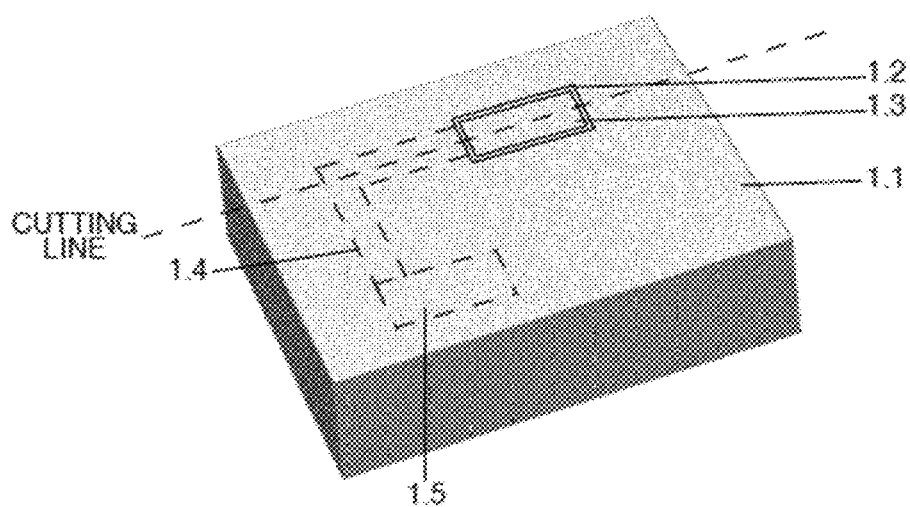
FIGS. 1A and 1B are a schematic representation of the integration of electronics in existing products in the prior art.
Figure 1B:
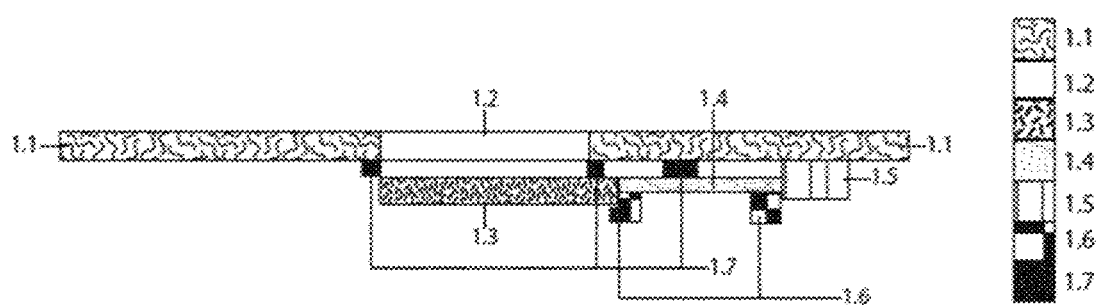

FIGS. 1A and 1B are a schematic representation of the integration of electronics in existing products as is known in the prior art. The product includes a surface 1.1, on which the electronics will be applied. FIG. 1A shows a three-dimensional view of the product and FIG. 1B shows a cross section through the surface 1.1. This surface 1.1 may be, for example, the paper or cardboard surface of a packaging. In the surface 1.1, an electronics includes a display device 1.3, such as a light-emitting diode (LED), is to be integrated. For this purpose, in the prior art it is necessary to cut open the surface 1.1 of the product. In FIG. 1A, this is shown schematically by the broken line (cut). After this, the electronic components such as the display device 1.3, the battery 1.5, and cable 1.4 for connecting the battery 1.5 to the display device 1.3 are placed behind the surface 1.1 opened up by the cut. Typical paper and cardboard surfaces of the packaging of products are not transparent or not sufficiently transparent to allow the light signal of the display device to become visible. For this reason, it is necessary to provide, at the position of the display device 1.3, a cutout or opening 1.2 in the surface 1.1. The opening 1.2 thus constitutes an inhomogeneity, which allows the consumer to see that an electronics has been integrated. FIG. 1B shows a cross section through the electronics introduced into the surface along the broken line shown in FIG. 1A. Besides the punching and cutting for the insertion, it is necessary to connect the electrical components such as the battery 1.5 and the cable 1.4 on the opposite side of the surface 1.1. In the prior art, therefore, the electronics is often assembled in advance, with the aid of costly soldering processes. After this, the electronics is placed behind the surface 1.1, for example with a mounter, wherein adhesives 1.7 and/or solder 1.6 are needed in order to fasten the electronics to the inner side of the surface 1.1.

Figure 2A:
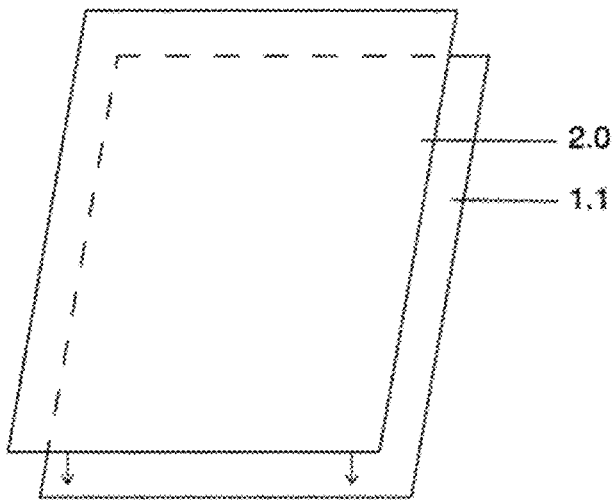
FIGS. 2A-2C are schematic representations of a preferred embodiment of the sheetlike component according to the invention and illustration of its integration in a product.
Figure 2B:
Figure 2C:
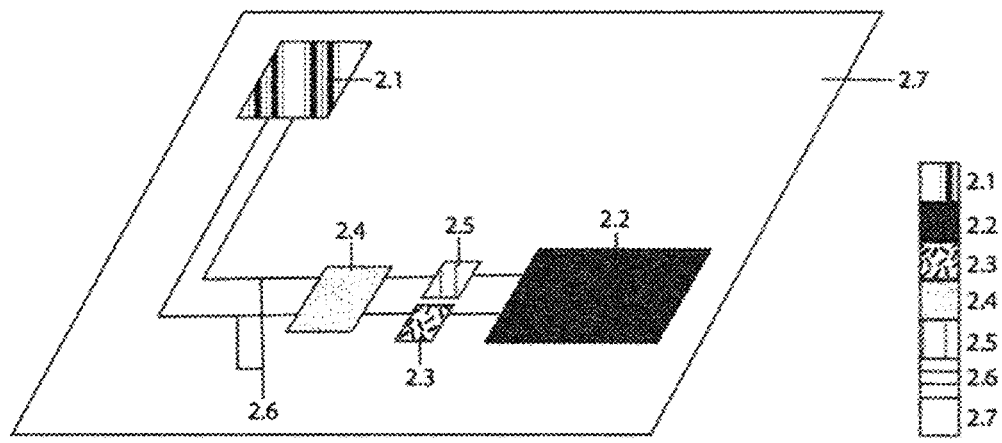

FIGS. 2A-2C show a preferred embodiment of the sheetlike component 2.0 according to the invention and its integration in the surface 1.1 of a product. With the aid of the sheetlike component 2.0 according to the invention, it is not necessary to cut open the surface 1.1 of the product for the integration of the electronics. Instead, the sheetlike component 2.0 according to the invention, in which the electronics is already integrated, is applied by a simple glue to the surface 1.1 of the product (FIG. 2A). It is especially preferable for the dimension of the sheetlike component 2.0 to be adapted to the size of the surface 1.1, so that no edges are visible. In this way, the integration of the sheetlike component 2.0 on the product surface 1.1 is not visible to the customer, unlike the case of destructive methods. The sheetlike component 2.0 is preferably less than 0.3 mm thick and may be considered to be a laminate made of at least two, preferably at least three layers. FIG. 2B shows a cross section through the product surface 1.1 and the sheetlike component 2.0. FIG. 2C illustrates the electronics integrated in the sheetlike component 2.0. As its bottom layer, the sheetlike component 2.0 has a nonconducting substrate 2.7. On the substrate 2.7 is placed a display device 2.1, such as an OLED, and an energy source 2.2, such as a battery. Furthermore, other electronic components may be placed on the substrate 2.7. Preferably, this is done at least in part with the aid of a printing process. In the preferred embodiment shown, conductor tracks 2.6 are present on the substrate 2.7, connecting the display device 2.1 to a control electronics 2.4, which may include a receiver unit, for example, to actuate the display device 2.1 with the aid of an external device (not shown). In the embodiment shown, the control electronics is connected to a sensor 2.3 and/or a switch 2.5. The sensor 2.3 may be a light-sensitive sensor, for example, which releases a voltage from the energy source 2.2, such as a battery, to the display device 2.1. It may also be preferable for this purpose that the switch 2.5 brings about the releasing of electric current from the energy source 2.2 to the display device 2.1 for example by a pressing action. The switch 2.5 and the sensor 2.3 can regulate the connection of the display device 2.1 to the energy source 2.2 either alternatively to each other or in combination. It is preferable for the middle layer, including the electronics, to be covered by a printable cover layer 3.1. The functioning of a preferred embodiment of the top layer of the printable cover layer 3.1 is shown in FIGS. 3A and 3B.

Figure 3A:
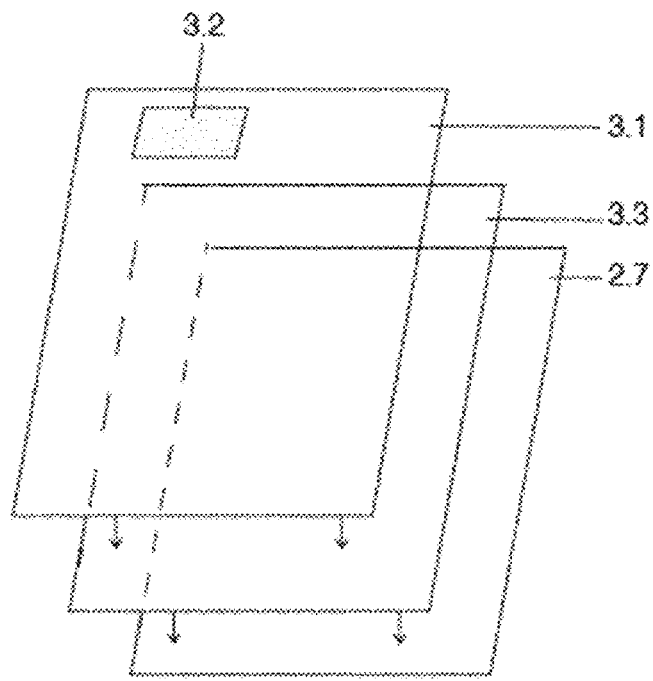
FIGS. 3A and 3B are schematic representations of a preferred embodiment of the sheetlike component according to the invention to illustrate preferred cover layers.
Figure 3B:
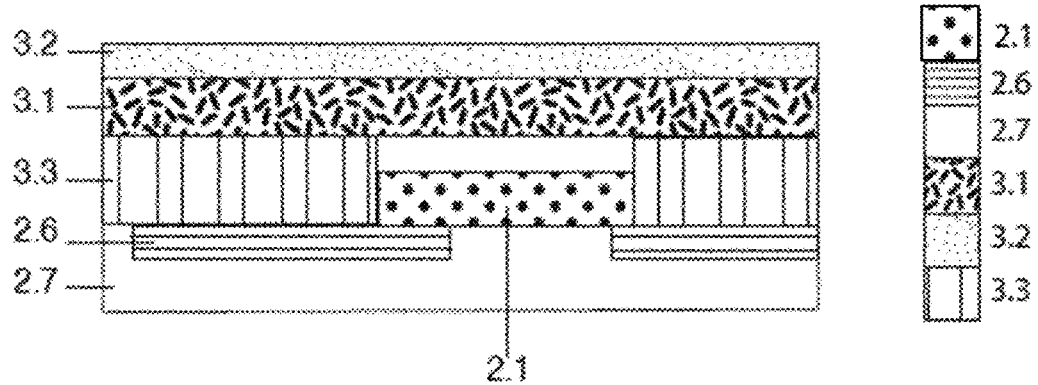

FIGS. 3A and 3B show a schematic representation of a preferred embodiment of the sheetlike component according to the invention as an illustration of preferred cover layers. On the substrate 2.7, as shown in FIG. 2C, there is placed an electronics. For easier comprehension, this is not shown in FIG. 3A. In the embodiment shown, at first a nonconducting cap layer 3.3 is placed on the electronics, for example by screen printing. This serves in particular as additional optical covering, in order to conceal the components of the electronics. On the nonconducting cap layer 3.3, there is placed in the preferred embodiment a printable cover layer 3.1. It may also be preferable to place the cover layer 3.1 directly on the substrate. The cover layer is preferably at least partly translucent, so that the display device 2.1 can shine through the cover layer 3.1. It is preferable to place a colored imprint 3.2, for example with the aid of various glazing steps, on the printable cover layer 3.1. Preferably, the colors of the imprint are chosen such that the desired light signal of the display device 2.1 remains visible, while other electronics components such as the conductor tracks 2.6 are covered up.

FIG. 3B shows a cross sectional representation of a cutout of the sheetlike electronic component of FIG. 3A. The display device 2.1 is connected by conductor tracks 2.6 to an energy source (not shown). A nonconducting cap layer 3.3 has been placed with the aid of a printing process, preferably screen printing, on the conductor tracks 2.6, but not on the display device 2.1, being optically opaque and thus concealing the conductor tracks 2.6. On top of the display device 2.1, and also on top of the cap layer 3.3, there is placed a printable cover layer 3.1, which is at least partly translucent. The cover layer 3.1 may be optically configured by placement of an imprint 3.2, preferably a colored layer, as is desired for the product. Preferably, the printer color for the imprinting of the cover layer 3.1 is chosen such that the light signal of the display device 2.1 can shine through the cover layer 3.1 and the imprint 3.2. In this way, a homogeneous design surface is obtained, with the display device 2.1 being optically integrated in the product surface 1.1, and without the customer being able to see that the product contains an electronics.

It is pointed out that various alternatives to the described embodiments of the invention can be used to implement the invention and arrive at the solution according to the invention. The sheetlike electronic component according to the invention as well as its manufacture in the described method are therefore not limited in their embodiments to the foregoing preferred embodiments. Instead, many variant embodiments are conceivable, which may differ from the represented solution. The aim of the claims is to define the protection scope of the invention. The protection scope of the claims is meant to cover the optoelectronic component according to the invention and the method for its manufacture as well as equivalent embodiments thereof.

LIST OF REFERENCE NUMBERS 1.1 Side surface of a product
1.2 Opening for display device
1.3 Display device
1.4 Cable
1.5 Battery
1.6 Solder
1.7 Adhesive
2.0 Sheetlike electronic component
2.1 Display device
2.2 Energy source
2.3 Sensor
2.4 Control electronics
2.5 Switch
2.6 Conductor tracks
2.7 Nonconducting substrate
3.1 Printable cover layer
3.2 Imprint
3.3 Nonconducting cap layer

The invention claimed is:
1. A sheetlike electronic component comprising:
a middle layer of electronics, comprising a display device that generates a light signal, an energy source, and a conductor track;
of a printable cover layer applied to the middle layer, wherein the cover layer is at least partly translucent so as to scatter the light signal at the translucent cover layer to serve as a projection screen;
wherein the display device is an organic light-emitting diode;
wherein the middle layer of electronics is placed onto the printable cover layer, which is a first nonconducting substrate; or
wherein the component comprises a separate layer of a second nonconducting substrate and wherein the middle layer of electronics is placed onto said separate layer of the second nonconducting substrate; and
wherein the middle layer of electronics is placed onto either the first nonconducting substrate or the second nonconducting substrate at least partly or entirely using a printing process.
2. The sheetlike electronic component of claim 1 wherein the component has a thickness less than 0.3 mm.

3. The sheetlike electronic component of claim 1 wherein the printing process for application of the middle layer of electronics is chosen from a group consisting of inkjet, screen printing, flexographic printing, and offset printing.

4. The sheetlike electronic component of claim 1 wherein the organic light-emitting diode comprises a cathode, an anode and a layer system between the cathode and the anode, having:
- at least one electron injection layer near the cathode;
- at least one electron transport layer;
- at least one optically active layer;
- at least one hole transport layer;
- at least one hole injection layer near the anode; and
- wherein the at least one electron injection layer and the at least one hole injection layer are diffusion-limiting with respect to at least one of water or oxygen, and the at least one electron transport layer and the at least one hole transport layer constitute a diffusion barrier to at least one of water or oxygen.

5. The sheetlike electronic component of claim 1 wherein the energy source comprises a battery, an organic solar cell, or a capacitor.

6. The sheetlike electronic component of claim 1 wherein the conductor track comprises silver, copper, or carbon as printing material.

7. The sheetlike electronic component of claim 1 wherein the cover layer comprises cellulose-containing materials, preferably paper or cardboard, especially preferably transparent paper, waxed paper, or films of preferably polyethylene naphthalate (PEN) or polyethylene terephthalate (PET).

8. The sheetlike electronic component of claim 1 wherein the first nonconducting substrate or the second nonconducting substrate comprises at least one of paper or PET.

9. The sheetlike electronic component of claim 1 wherein an additional nonconducting cap layer is present between the cover layer and the middle layer of electronics, the nonconducting cap layer having a cutout for the display device.

10. The sheetlike electronic component of claim 1 wherein the middle layer of electronics further comprises a switch for the activation of the display device.

11. The sheetlike electronic component of claim 1 wherein the cover layer has a cutout above the conductor track, whereby a circuit is closed by the conductor track contacting a conductive object, so that the display device lights up.

12. The sheetlike electronic component of claim 1 wherein the middle layer of electronics further comprises a sensor, preferably a light sensor.

13. The sheetlike electronic component of claim 1 wherein the middle layer of electronics further comprises a control electronics with one or more transistors.

14. A method for manufacturing the sheetlike electronic component as claimed in claim 1 where the component comprises the separate layer of the second nonconducting substrate, the method comprising:
- providing the second nonconducting substrate;
- applying the middle layer of electronics comprising the display device, the energy source, and the conductor tracks onto the second nonconducting substrate; and
- applying the printable cover layer, which is at least partly translucent, onto the middle layer of electronics to form the projection screen.

15. A method for manufacturing the sheetlike electronic component as claimed in claim 1, wherein the printable cover layer is the first nonconducting substrate, the method comprising:
- providing the printable cover layer, which is at least partly translucent;
- applying a cap layer onto a first side of the cover layer; and
- applying the middle layer of electronics onto an opposite second side of the cover layer or onto the cap layer.

16. A use of the sheetlike electronic component claim 1 for the design of products and packages, especially print and paper products, wherein the sheetlike electronic component is applied onto a surface of the products or packages with the aid of an adhesive.

17. A product wherein the sheetlike electronic component of claim 1 is applied onto a surface of the product.

18. The product of claim 17 wherein the surface is a cardboard or a paper, and the surface is applied to a corrugated cardboard with the aid of adhesive bonding.

* * * * *